(12) United States Patent
Wu et al.

(10) Patent No.: US 11,394,392 B2
(45) Date of Patent: Jul. 19, 2022

(54) FLASH ANALOG TO DIGITAL CONVERTER

(71) Applicant: REALTEK SEMICONDUCTOR CORPORATION, Hsinchu (TW)

(72) Inventors: Chien-Ming Wu, Hsinchu (TW);
Shih-Hsiung Huang, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 17/333,049

(22) Filed: May 28, 2021

(65) Prior Publication Data
US 2022/0052705 A1 Feb. 17, 2022

(30) Foreign Application Priority Data
Aug. 17, 2020 (TW) ................................ 109127895

(51) Int. Cl.
*H03M 1/20* (2006.01)
*H03M 1/36* (2006.01)

(52) U.S. Cl.
CPC ........... *H03M 1/205* (2013.01); *H03M 1/206* (2013.01); *H03M 1/365* (2013.01)

(58) Field of Classification Search
CPC ...... H03M 1/205; H03M 1/206; H03M 1/365; H03F 3/211; H03F 3/45188; H03F 3/45192

See application file for complete search history.

(56) References Cited

U.S. PATENT DOCUMENTS

| 7,554,477 B2 | 6/2009 | Hung et al. |
| 8,223,047 B2 * | 7/2012 | Lai ........................ H03M 1/365 341/120 |

(Continued)

FOREIGN PATENT DOCUMENTS

TW 200843358 A 11/2008

OTHER PUBLICATIONS

Y. Lin, C. Lin and S. Chang, "A 5-bit 3.2-GS/s Flash ADC With a Digital Offset Calibration Scheme," in IEEE Transactions on Very Large Scale Integration (VLSI) Systems, vol. 18, No. 3, pp. 509-513, Mar. 2010, doi: 10.1109/TVLSI.2009.2013628.

(Continued)

*Primary Examiner* — Lam T Mai
(74) *Attorney, Agent, or Firm* — WPAT, PC

(57) ABSTRACT

A flash analog to digital converter includes a voltage generator circuit, an encoder circuit, and first and second double differential amplifier circuits. The voltage generator circuit generates reference voltages according to first and second voltages. The encoder circuit generates a digital signal corresponding to an input signal according to first signals. The first double differential amplifier circuit compares the input signal with a first reference voltage in the reference voltages, to generate a corresponding one of the first signals. The second double differential amplifier circuit compares the input signal with a second reference voltage in the reference voltages, to generate a corresponding one of the first signals. A difference between the first voltage and the first reference voltage is less than that between the first voltage and the second reference voltage, and the first and the second double differential amplifier circuits have different circuit architectures.

14 Claims, 5 Drawing Sheets

(56) References Cited

U.S. PATENT DOCUMENTS

| | | | |
|---|---|---|---|
| 8,350,737 B2* | 1/2013 | Sanduleanu | H03M 1/1061 |
| | | | 341/120 |
| 8,674,861 B2* | 3/2014 | Matsuno | H03M 1/12 |
| | | | 341/120 |
| 8,928,508 B2* | 1/2015 | Lai | H03M 1/1009 |
| | | | 341/120 |
| 9,344,106 B2* | 5/2016 | Lai | H03M 1/1009 |
| 9,467,160 B2 | 10/2016 | Chang | |
| 2002/0118048 A1* | 8/2002 | Kulhalli | H03K 5/24 |
| | | | 327/68 |
| 2005/0168370 A1* | 8/2005 | Mokhtari | H03M 1/1057 |
| | | | 341/158 |
| 2015/0097710 A1* | 4/2015 | Lai | H03M 1/1009 |
| | | | 341/161 |
| 2022/0069831 A1* | 3/2022 | Huang | H03F 3/00 |

OTHER PUBLICATIONS

Y. Shu, "A 6b 3GS/s 11mW fully dynamic flash ADC in 40nm CMOS with reduced No. of comparators," 2012 Symposium on VLSI Circuits (VLSIC), 2012, pp. 26-27, doi: 10.1109/VLSIC.2012.6243772.

OA letter of tne counterpart TW application (appl. No. 109127895) mailed on Apr. 28, 2021. Summary of the OA letter: 1.Claims 1, 2,4-6, and 8-10 are rejected as allegedly being unpatentable over first cited reference (U.S. Pat. No. 9467160 B2) in view of second cited refrence (TW 200843358 A, also published as U.S. Pat. No. 7,554,477). 2.Claims 3 and 7 are allowable.

\* cited by examiner

2

FLASH ANALOG TO DIGITAL CONVERTER

BACKGROUND

1. Technical Field

The present disclosure relates to a flash analog to digital converter. More particularly, the present disclosure relates to a flash analog to digital converter having comparator circuits that have different circuit architectures.

2. Description of Related Art

In current approaches, all comparator circuits in a flash analog to digital converter have the same circuit architectures. However, under certain server bias conditions or in a case where an input signal having higher swing, certain comparator circuits may not able to properly work in a predetermined operation region, which results in operation failure of the flash analog to digital converter.

SUMMARY

In some aspects of the present disclosure, a flash analog to digital converter includes a voltage generator circuit, an encoder circuit, a first double differential amplifier circuit, and a second double differential amplifier circuit. The voltage generator circuit is configured to generate a first set of reference voltages according to a first voltage and a second voltage. The encoder circuit is configured to generate a digital signal corresponding to an input signal according to a plurality of first signals. The first double differential amplifier circuit is configured to compare the input signal with a first reference voltage in the first set of reference voltages, in order to generate a corresponding one of the plurality of first signals. The second double differential amplifier circuit is configured to compare the input signal with a second reference voltage in the first set of reference voltages, in order to generate a corresponding one of the plurality of first signals. A difference between the first voltage and the first reference voltage is less than a difference between the first voltage and the second reference voltage, and the first double differential amplifier circuit and the second double differential amplifier circuit have different circuit architectures.

These and other objectives of the present disclosure will be described in preferred embodiments with various figures and drawings.

DETAILED DESCRIPTION

The terms used in this specification generally have their ordinary meanings in the art and in the specific context where each term is used. The use of examples in this specification, including examples of any terms discussed herein, is illustrative only, and in no way limits the scope and meaning of the disclosure or of any exemplified term. Likewise, the present disclosure is not limited to various embodiments given in this specification.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other. In this document, the term "circuitry" may indicate a system formed with one or more circuits. The term "circuit" may indicate an object, which is formed with one or more transistors and/or one or more active/passive elements based on a specific arrangement, for processing signals.

As used herein, the term "and/or" includes any and all combinations of one or more of the associated listed items. Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. For ease of understanding, like elements in various figures are designated with the same reference number.

Figure 1:
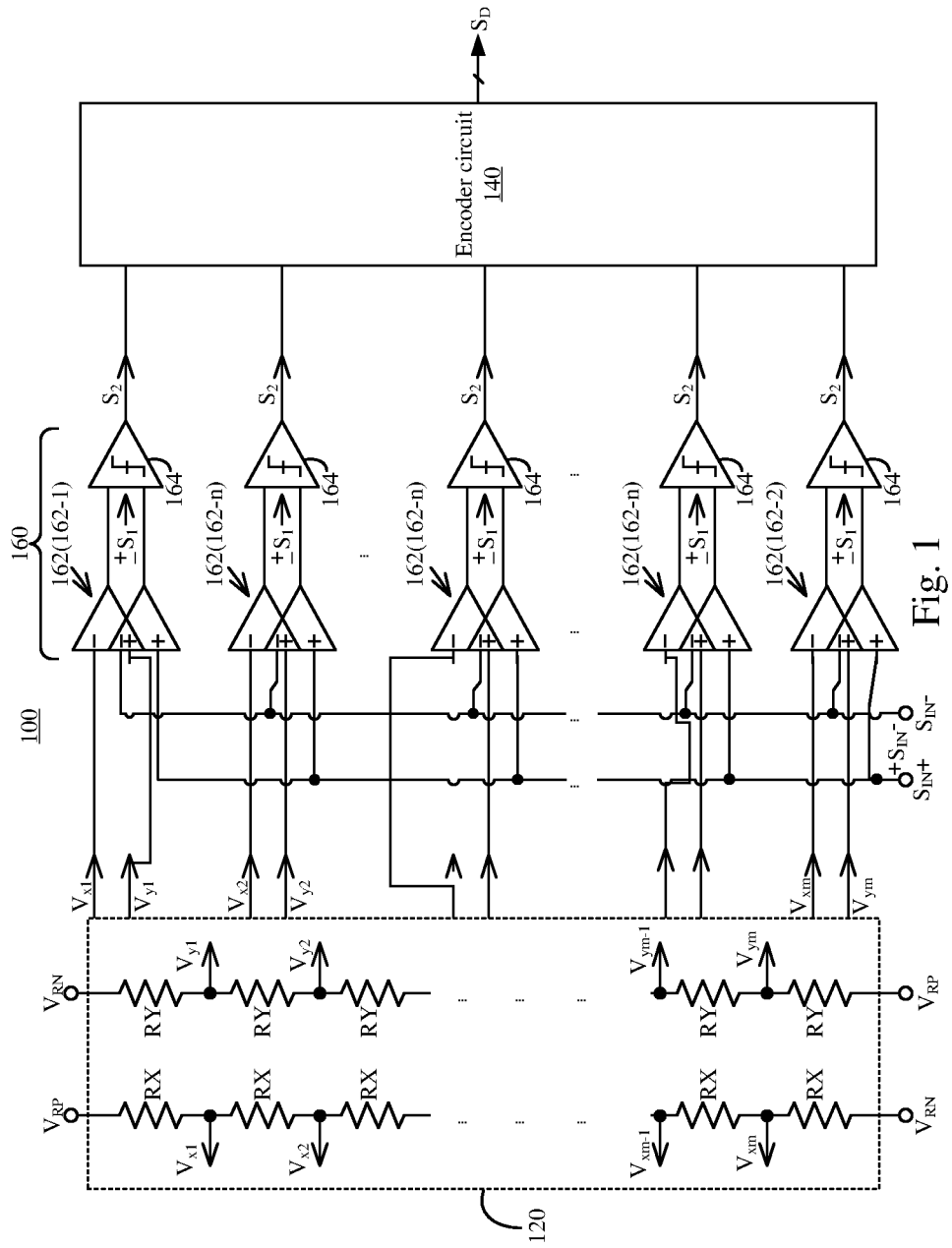
FIG. 1 is a schematic diagram of a flash analog to digital converter according to some embodiments of the present disclosure.

FIG. 1 is a schematic diagram of a flash analog to digital converter 100 according to some embodiments of the present disclosure. The flash analog to digital converter 100 may converter an input signal $S_{IN}$ to be a corresponding digital signal $S_D$, in which the input signal $S_{IN}$ is a difference between an input signal $S_{IN}+$ and an input signal $S_{IN}-$.

The flash analog to digital converter 100 includes a reference voltage generator circuit 120, an encoder circuit 140, and a comparator circuitry 160. The reference voltage generator circuit 120 is configured to generate a first set of reference voltages $V_{x1}$-$V_{xm}$ and a second set of reference voltages $V_{y1}$-$V_{ym}$ according to a voltage $V_{RP}$ and a voltage $V_{RN}$. For example, the reference voltage generator circuit 120 includes resistors RX and resistors RY. The resistors RX operate as a voltage divider circuit, in order to generate the first set of reference voltages $V_{x1}$-$V_{xm}$ according to the voltage $V_{RP}$ and the voltage $V_{RN}$. The reference voltage $V_{x1}$ is a voltage closest to the voltage $V_{RP}$ in the first set of reference voltages $V_{x1}$-$V_{xm}$, and the reference voltage $V_{xm}$ is a voltage closet to the voltage $V_{RN}$ in the first set of reference voltages $V_{x1}$-$V_{xm}$. In other words, a difference between the voltage $V_{RP}$ and the reference voltage $V_{x1}$ is less than a difference between the voltage $V_{RP}$ and one of the reference voltage $V_{x2}$-$V_{xm}$, and a difference between the voltage $V_{RN}$ and the reference voltage $V_{xm}$ is less than a difference between the voltage $V_{RN}$ and one of the reference voltages $V_{x1}$-$V_{xm-1}$.

Similarly, the resistors RY operate as a voltage divider circuit, in order to generate the second set of reference voltages $V_{y1}$-$V_{ym}$ according to the voltage $V_{RN}$ and the voltage $V_{RP}$. The reference voltage $V_{y1}$ is a voltage closet to the voltage $V_{RN}$ in the second set of reference voltages $V_{y1}$-$V_{ym}$, and the reference voltage $V_{ym}$ is a voltage closet to the voltage $V_{RP}$ in the second set of reference voltages $V_{y1}$-$V_{ym}$. In other words, a difference between the voltage $V_{RN}$ and the reference voltage $V_{y1}$ is less than a difference between the voltage $V_{RN}$ and one of the reference voltages $V_{y2}$-$V_{ym}$, and a difference between the voltage $V_{RP}$ and the reference voltage $V_{ym}$ is less than a difference between voltage $V_{RP}$ and one of the reference voltages $V_{y1}$-$V_{ym-1}$.

The implementations of the reference voltage generator circuit 120 are given for illustrative purposes, and the present disclosure is not limited thereto. Various types of the reference voltage generator circuit 120 are within the contemplated scope of the present disclosure.

The encoder circuit 140 generates the digital signal $S_D$ according to signals $S_1$. For example, the comparator circuitry 160 generates the signals $S_1$ according to the input signal $S_{IN}$, the first set of reference voltages $V_{x1}$-$V_{xm}$, and the second set of reference voltages $V_{y1}$-$V_{ym}$, and generates signals $S_2$ according to the signals $S_1$. The encoder circuit 140 may encode the signals $S_2$ to generate the digital signal $S_D$. In some embodiments, the signals $S_2$ are thermometer codes, and the digital signal $S_D$ is a binary code. In some embodiments, the encoder circuit 140 may be implemented with one or more logic circuits.

The comparator circuitry 160 is configured to compare the input signal $S_{IN}$ with the first set of reference voltages $V_{x1}$-$V_{xm}$ and the second set of reference voltages $V_{y1}$-$V_{ym}$, in order to generate the signals $S_2$. In this embodiment, the comparator circuitry 160 includes double differential amplifier circuits 162 and latch circuits 164, in which a corresponding set of the double differential amplifier circuit 162 and the latch circuit 164 operate as a single comparator circuit. In other words, a double differential amplifier circuit 162-1 (or 162-2) is a portion of a comparator circuit, and a double differential amplifier circuit 162-n is a portion of another comparator circuit.

Each double differential circuit 162 is configured to compare the input signal $S_{IN}$+ with a corresponding one of the first set of reference voltages $V_{x1}$-$V_{xm}$, and to compare the input signal $S_{IN}$− with a corresponding one of the second set of reference voltages $V_{y1}$-$V_{ym}$, in order to generate a corresponding one of the signals $S_1$. The signal $S_1$ may be a voltage difference between two output terminals of the double differential amplifier circuit 162. Taking the first double differential amplifier circuit 162 (labeled as 162-1) as an example, the first double differential amplifier circuit 162-1 compares the input signal $S_{IN}$+ with the reference voltage $V_{x1}$, and compares the input signal $S_{IN}$− with the reference voltage $V_{y1}$, in order to generate a first one of the signals $S_1$. With this analogy, the last double differential amplifier circuit 162 (labeled as 162-2) compares the input signal $S_{IN}$+ with the reference voltage $V_{xm}$, and compares the input signal $S_{IN}$− with the reference voltage $V_{ym}$, in order to generate a last one of the signals $S_1$.

The latch circuits 164 are configured to generate the signals $S_2$ according to the signals $S_1$. In some embodiments, each latch circuit 164 may be a circuit having a positive feedback, which is configured to pull the corresponding signal $S_1$ to a rail-to-rail level, in order to generate a corresponding signal $S_2$.

In some related approaches, all comparator circuits in the flash analog to digital converter have the same circuit architecture. However, in these approaches, operations of certain comparator circuits may fail due to systematic mismatches and random mismatches caused from extreme bias condition(s). Compared with these approaches, in some embodiment of the present disclosure, certain comparator circuits in the comparator circuitry 160 are configured to have different circuit architectures. For example, the double differential amplifier circuit 162-1 (and/or the double differential amplifier circuit 162-2) and the remaining double differential amplifier circuits 162 (labeled as 162-n) have different circuit architectures. The reference voltage $V_{x1}$ and the reference voltage $V_{y1}$ have higher difference therebetween. Similarly, the reference voltage $V_{xm}$ and the reference voltage $V_{ym}$ have higher difference therebetween. Under this condition, a bias condition of the double differential amplifier circuit 162-1 (and/or the double differential amplifier circuit 162-2) and bias conditions of the remaining double differential amplifier circuits 162-n have considerable differences therebetween. Therefore, by employing different circuit architectures, it assured that the double-different amplifier circuit 162-1 (and/or the double differential amplifier circuit 162-2) may stably operate under extreme bias condition(s) (for example, circuit(s) may keep gain and bandwidth within a predetermined range and work in a predetermined operation region), in order to avoid operation failure. Detailed descriptions regarding herein will be provided with reference to FIG. 3A and FIG. 3B. In other words, the double differential amplifier circuit 162-1 (and/or the double differential amplifier circuit 162-2) is much more robust under the extreme bias condition(s).

In some embodiments, according to practical requirements (which may be, for example, bias conditions, the amplitude of the input signal $S_{IN}$, and so on), the number of amplifier circuits that have different circuit structures in the double differential amplifier circuits 162 may be adjusted correspondingly. For example, in some embodiments, the double differential amplifier circuits 162 that receive the reference voltages and the reference voltages $V_{y1}$-$V_{y2}$ (or the reference voltages $V_{xm-1}$-$V_{xm}$ and the reference voltages $V_{ym-1}$-$V_{ym}$) and the remaining double differential amplifier circuits 162 may have different circuit architectures. Accordingly, the present disclosure is not limited to examples in FIG. 1.

Figure 2:
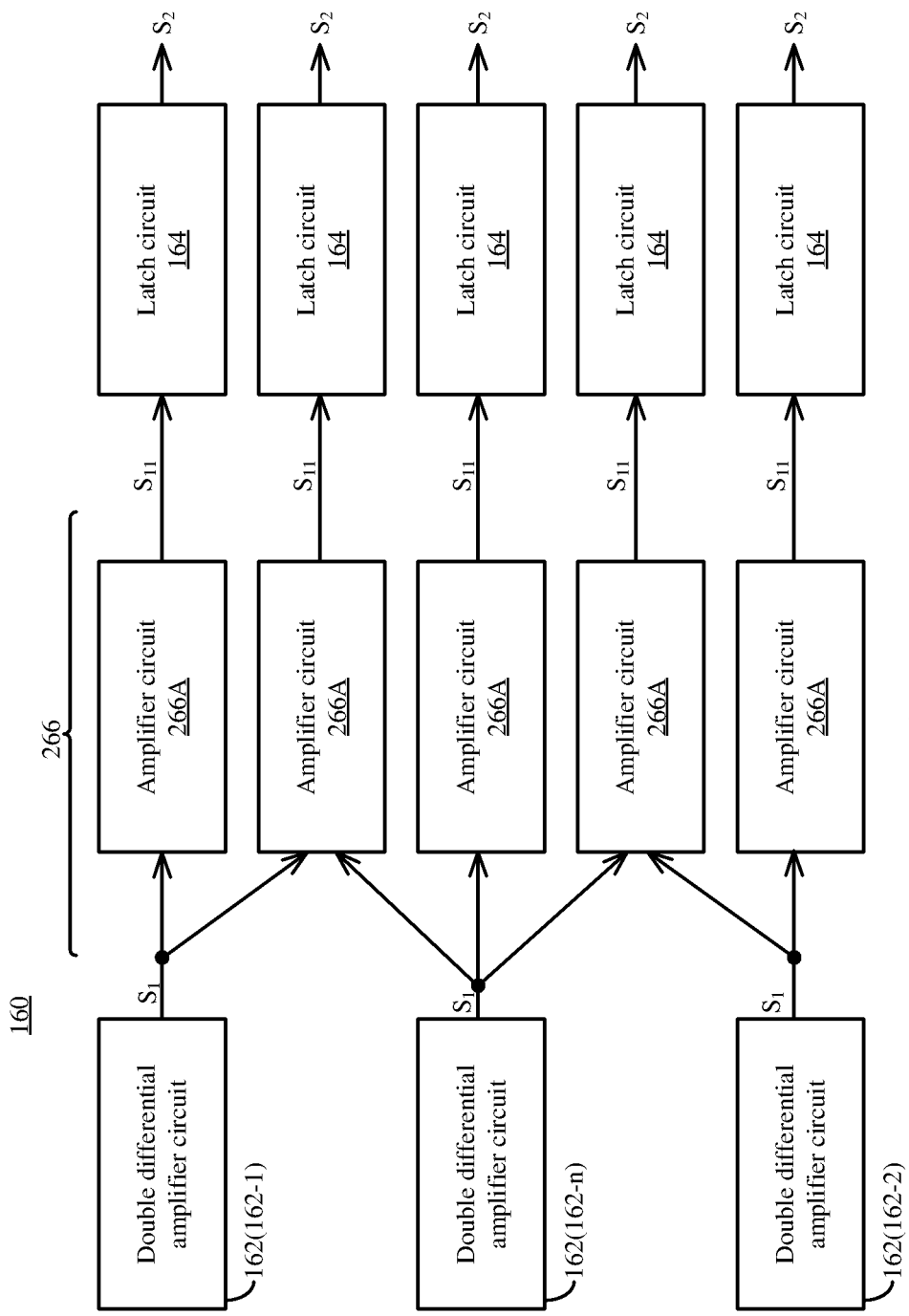
FIG. 2 is a schematic diagram of the comparator circuitry in FIG. 1 according to some embodiments of the present disclosure.

FIG. 2 is a schematic diagram of the comparator circuitry 160 in FIG. 1 according to some embodiments of the present disclosure. In this embodiment, the comparator circuitry 160 further includes an interpolation network 266. The interpolation network 266 is configured to perform an interpolation according to the signals $S_1$, in order to generate signals $S_{11}$. As shown in FIG. 2, the interpolation network 266 may share two output signals (e.g., the signal $S_1$) from the previous stage circuits (e.g., the double differential amplifier circuits 162) to perform the interpolation. Accordingly, compared with FIG. 1, the number of the double differential amplifier circuits 162 employed in the comparator circuitry 160 may be decreased.

In some embodiments, the interpolation network 266 may be an active circuit that includes amplifier circuits 266A. The amplifier circuits 266A are configured to amplify the signals $S_1$ to generate the signals $S_{11}$. Each amplifier circuit 266A performs the interpolation according to one or two corresponding signals $S_1$, in order to generate the corresponding signal $S_{11}$. Each latch circuit 164 generates a corresponding one of the signals $S_2$ according to the corresponding signal $S_{11}$.

The implantations of the interpolation network 266 are given for illustrative purposes, and the present disclosure is not limited thereto. In some embodiments, the interpolation network 266 may further include more amplifier circuits (not shown), which are coupled between the amplifier circuits 266A and the latch circuits 164 and configured to amplify the signals $S_{11}$ and transmit the amplified signals $S_{11}$ to the latch circuits 164. In some embodiments, the interpolation may be performed by the latch circuits 164. For example, the amplifier circuits 266A receive the signals $S_1$ from the double differential amplifier circuits 162 respectively, in order to generate the signals $S_{11}$. Each latch circuit 164 may perform the interpolation according one or two signals in the signals $S_{11}$. In some other embodiments, the interpolation network 266 may be a passive circuit. For example, the interpolation network 266 may be a resistive network (not shown), which may generate voltages according to the signals $S_1$ and transmit one or two of the voltages to each latch circuit 164. Various types of the interpolation network 266 are within the contemplated scope of the present disclosure.

Figure 3A:
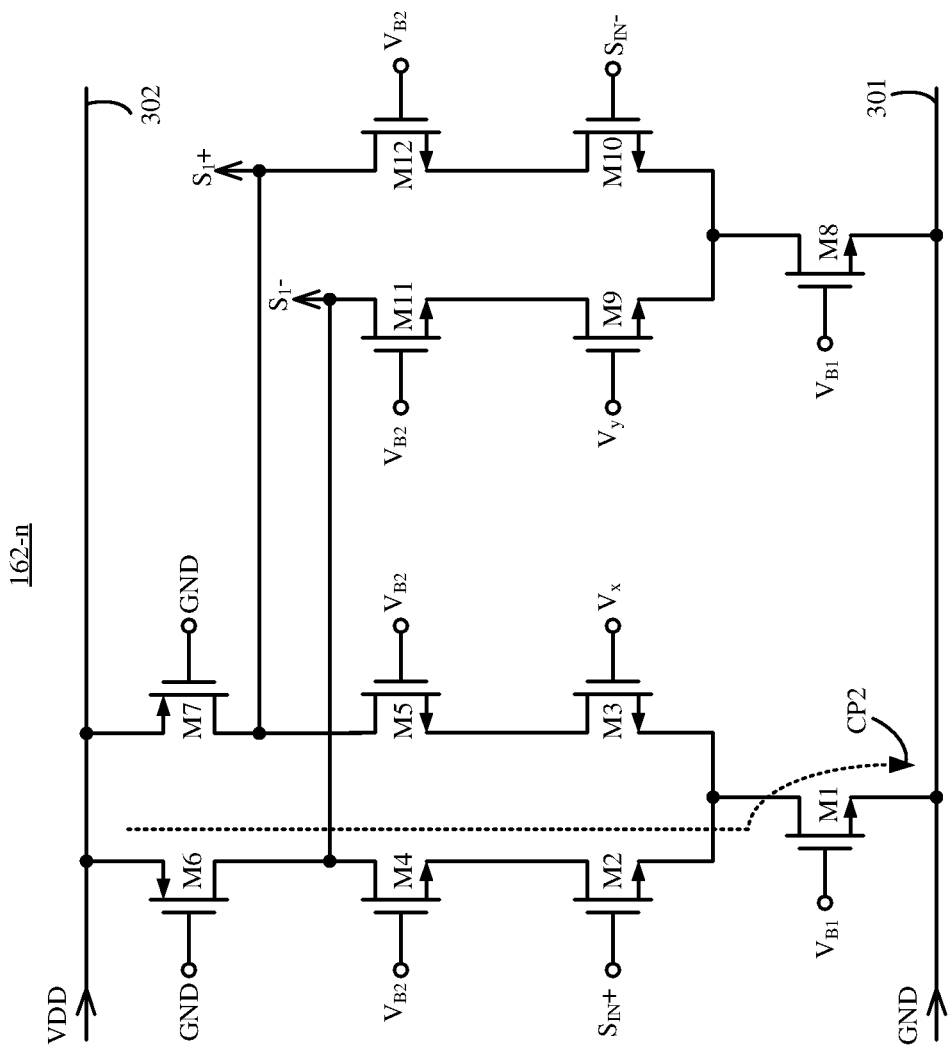
FIG. 3A is a schematic diagram of the double differential amplifier circuit in FIG. 1 according to some embodiments of the present disclosure.

FIG. 3A is a schematic diagram of the double differential amplifier circuit 162-n in FIG. 1 according to some embodiments of the present disclosure. The double differential amplifier circuit 162-n includes transistors M1-M12. A first terminal (e.g., drain) of the transistor M1 is coupled to a second terminal (e.g., source) of the transistor M2, a second terminal (e.g., source) of the transistor M1 is coupled to a power rail 301 to receive a ground voltage GND, and a control terminal (e.g., gate) of the transistor M1 receives a bias signal $V_{B1}$. A first terminal of the transistor M2 is coupled to a second terminal of the transistor M4, and a control terminal of the transistor M2 receives the input signal $S_{IN}+$. A first terminal of the transistor M4 is coupled to a second terminal (e.g., source) of the transistor M6 to generate a signal $S_1-$, and a control terminal of the transistor M4 receives a bias signal $V_{B2}$. A first terminal (e.g., source) of the transistor M6 is coupled to a power rail 302 to receive a supply voltage VDD, and a control terminal of the transistor M6 is configured to receive the ground voltage GND.

A first terminal of the transistor M3 is coupled to a second terminal of the transistor M5, a second terminal of the transistor M3 is coupled to the first terminal of the transistor M1, and a control terminal of the transistor M3 receives a corresponding one of the reference voltages $V_{x2}$-$V_{xm-1}$ (labeled as $V_x$). A first terminal of the transistor M5 is coupled to a second terminal of the transistor M7, in order to generate a signal $S_1+$, and a control terminal of the transistor M5 receives the bias signal $V_{B2}$. A first terminal of the transistor M7 is coupled to the power rail 302, in order to receive the supply voltage VDD, and a control terminal of the transistor M7 is configured to receive the ground voltage GND.

A first terminal of the transistor M8 is coupled to a second terminal of the transistor M9, and a second terminal of the transistor M8 is coupled to the power rail to receive the ground voltage GND, and a control terminal of the transistor M8 receives the bias signal $V_{B1}$. A first terminal of the transistor M9 is coupled to a second terminal of the transistor M11, and a control terminal of the transistor M9 receives a corresponding one of the reference voltages $V_{y2}$-$V_{ym-1}$ (labeled as $V_y$). A first terminal of the transistor M11 is coupled to the second terminal of the transistor M6 to generate the signal $S_1-$, and a control terminal of the transistor M11 receives the bias signal $V_{B2}$.

A first terminal of the transistor M10 is coupled to a second terminal of the transistor M12, a second terminal of the transistor M10 is coupled to the first terminal of the transistor M8, and a control terminal of the transistor M10 receives the input signal $S_{IN}-$. A first terminal of the transistor M12 is coupled to the second terminal of the transistor M7 to generate the signal $S_1+$, and a control terminal of the transistor M12 receives the bias signal $V_{B2}$.

Each of the transistor M1 and the transistor M8 operates as a current source circuit, in order to bias the transistors M1-M7 and the transistors M9-M12. The transistors M2-M3 operate as a first input pair circuit, and the transistors M9-M10 operate as a second input pair circuit. The transistors M6-M7 operates a load circuit. An aspect ratio of each of the transistors M2-M3 and M9-M10 is the same as each other. As a result, each of the transistors M2, M3, M9, and M10 may have the same transconductance value theoretically. With circuit analysis, the signal $S_1$ can be derived as the following equation:

$$S_1 = S_1+ - S_1- = gm \cdot R_{ON} \cdot [(S_{IN}+ - V_x) - (S_{IN}- - V_y)],$$

in which gm is the aforementioned transconductance value, $R_{on}$ is an equivalent resistance value of each of the transistors M6 and M7, a difference between the signal $S_1+$ and the signal $S_1-$ is the signal $S_1$ in FIG. 1, and a difference between the input signal $S_{IN}+$ and the input signal $S_{IN}-$ is the input signal $S_{IN}$ in FIG. 1.

As the difference between the reference voltage $V_x$ and the reference voltage $V_y$ is relatively low, each of the transistors M2, M3, M9, and M10 has the similar bias condition. Accordingly, currents flowing through the respective transistors M2, M3, M9, and M10 are more matching, and thus these transistors may have similar transconductance values. As a result, the operations of the double differential amplifier circuit 162-n are less prone to fail.

Explained in a different way, if the differential double amplifier 162-1 (or 162-2) and the differential double amplifier 162-n have the same circuit architecture, the control terminal of the transistor M3 is adjusted to receive the reference voltage $V_{x1}$, and the control terminal of the transistor M9 is adjusted to receive the reference voltage $V_{y1}$. Under this condition, as the reference voltage $V_{x1}$ is closer to the voltage $V_{RP}$ and the reference voltage $V_{y1}$ is closer to the voltage $V_{RN}$ (for example, the reference voltage $V_{x1}$ is about 0.75 Volts, and the reference voltage $V_{y1}$ is about 0.25 volts), a bias condition of the first input pair circuit (i.e., transistors M2-M3) and that of the second input pair circuit (i.e., transistors M9-M10) have significant difference. In this case, the voltage of the first terminals of the transistors M2-M3 is limited by the transistors M4-M5, which results in a lower transconductance values of the transistors M2-M3. In certain extreme conditions, the transistors M2-M3 may erroneously work in a non-predetermined operation region (e.g., linear region) due to the above limitation. As a result, the operation of the differential double amplifier 162-1 (or 162-2) may fail.

Figure 3B:
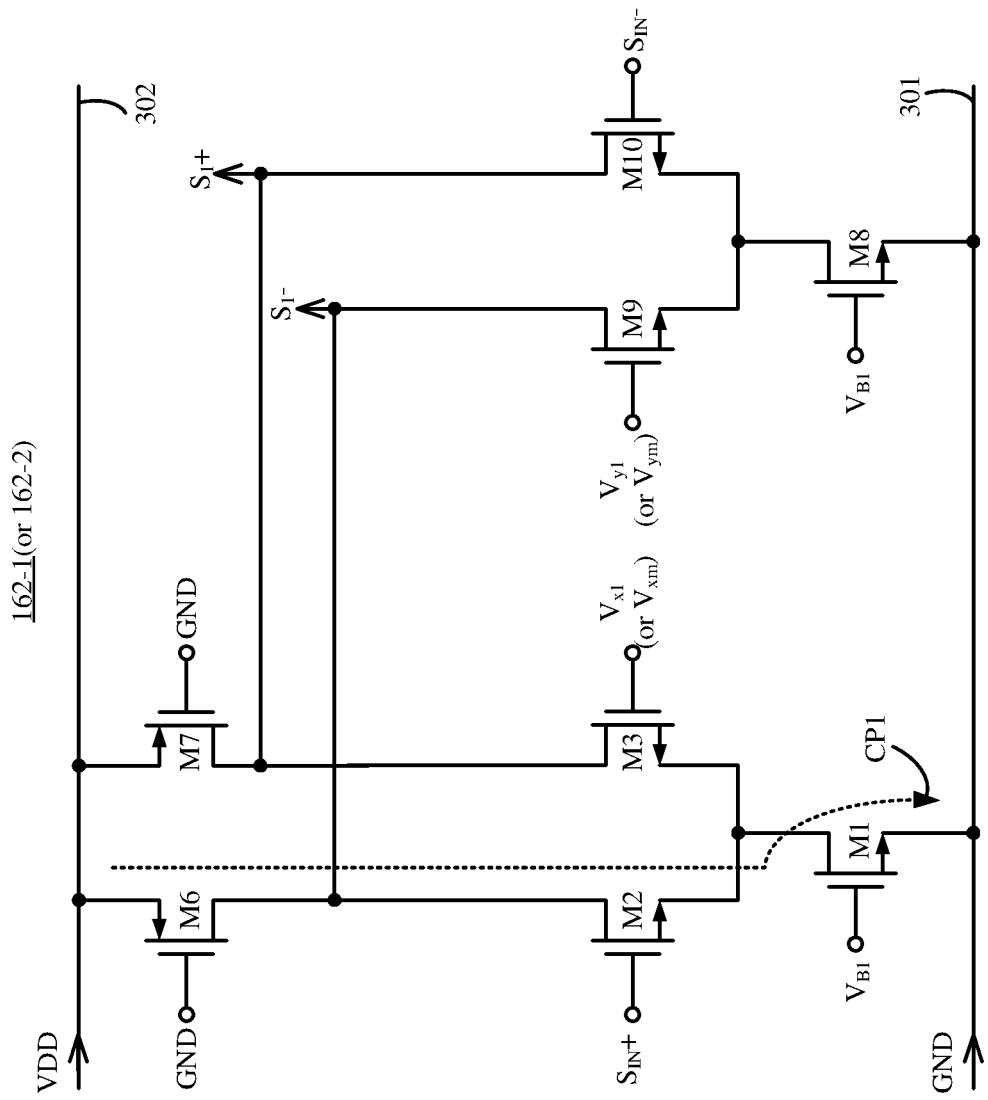
FIG. 3B is a schematic diagram of the double differential amplifier circuit in FIG. 1 according to some embodiments of the present disclosure.

FIG. 3B is a schematic diagram of the double differential amplifier circuit 162-1 (or 162-2) in FIG. 1 according to some embodiments of the present disclosure. It is understood that, if the circuit shown in FIG. 3B is the double differential amplifier circuit 162-1, the control terminal of the transistor M3 receives the reference voltage $V_{x1}$, and the control terminal of the transistor M9 receives the reference voltage $V_{y1}$. Alternatively, if the circuit shown in FIG. 3B is the double differential amplifier circuit 162-2, the control terminal of the transistor M3 receives the reference voltage $V_{xm}$, and the control terminal of the transistor M9 receives the reference voltage $V_{ym}$.

Compared with the double differential amplifier circuit 162-n in FIG. 3A, the double differential amplifier circuit 162-1 (or 162-2) excludes the transistors M4-M5 and M11-M12. In other words, in this example, the first terminals of the transistor M2 and M9 are coupled to the second terminal of the transistor M6 to generate the signal $S_1-$, and the first terminals of the transistors M3 and M10 are coupled to the second terminal of the transistor M7 to generate the signal $S_1+$. As a result, compared with the configurations of FIG. 3A, the transistors M2 and M3 (or M9 and M10) may have a higher voltage headroom to tolerate the extreme bias condition. As a result, it is able to prevent the transistors M2 and M3 (or M9 and M10) from working in the non-predetermined operation region erroneously, in order to improve the reliability of the double differential amplifier circuit 162-1 (or 162-2).

Explained in a different way, as shown in FIG. 3B, the double differential amplifier circuit 162-1 (or 162-2) includes a current path CP1 between the power rail 301 and the power rail 302, in which the current path CP1 includes stacked transistors (e.g., the transistors M1, M2, and M6). As shown in FIG. 3A, the double differential amplifier circuit 162-n includes a current path CP2 between the power rail 301 and the power rail 302, in which the current path CP2 includes stacked transistors (e.g., the transistors M1-M2 and M4-M6). The aforementioned stacked transistors are transistors forming a single current path between the power rail 301 and the power rail 302. A number of transistors in the current path CP1 is less than that in the current path CP2. Therefore, compared with the stacked transistors in the current path CP2, the stacked transistors in the current path CP1 may have higher voltage headroom, in order to be sufficient to work in the predetermined operation region (e.g., saturation region) under the extreme bias condition.

The implementations of the double differential amplifier circuit 162-1 (or 162-2) and those of the double differential amplifier circuit 162-n are given for illustrative purposes, and the present disclosure is not limited thereto. For example, the transistors M4 and M5 in FIG. 3A may be replaced with diode-connected transistors or other types of resistive components.

Figure 4:
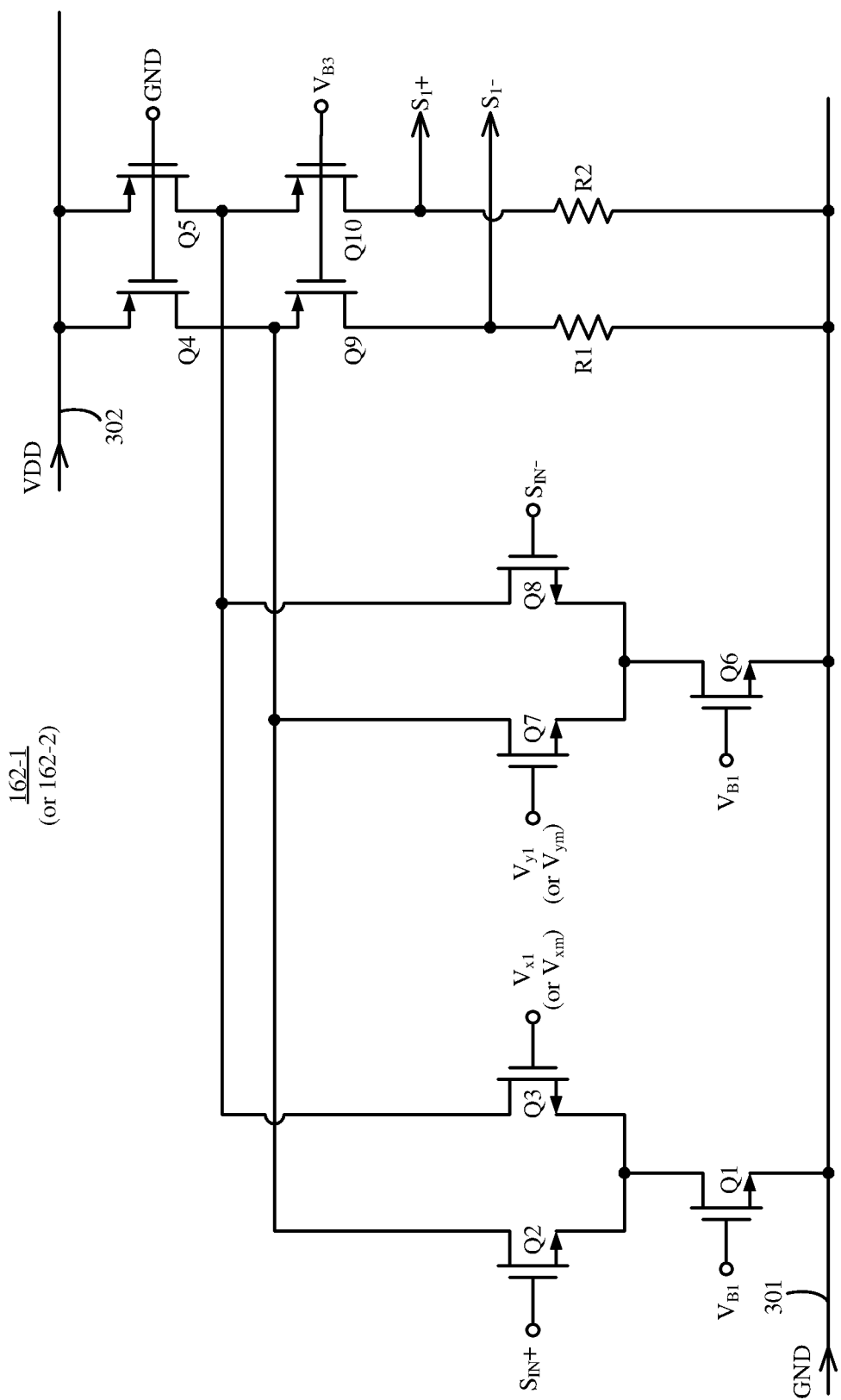
FIG. 4 is a schematic diagram of the double differential amplifier circuit in FIG. 1 according to some embodiments of the present disclosure.

FIG. 4 is a schematic diagram of the double differential amplifier circuit 162-1 (or 162-2) in FIG. 1 according to some embodiments of the present disclosure. In this embodiment, the double differential amplifier circuit 162-1 (or 162-2) is a folded cascode amplifier circuit. The double differential amplifier circuit 162-1 (or 162-2) includes transistors Q1-Q10, a resistor R1, and a resistor R2. The connections among the transistors Q1-Q8 are similar to those among the transistors M1-M3 and M6-M10 in FIG. 3B, and thus the repetitious descriptions are not further given herein. It is understood that, if the circuit in FIG. 4 is the double differential amplifier circuit 162-1, the control terminal of the transistor Q3 receives the reference voltage $V_{x1}$, and the control terminal of the transistor Q7 receives the reference voltage $V_{y1}$. Alternatively, if the circuit in FIG. 4 is the double differential amplifier circuit 162-2, the control terminal of the transistor Q3 receives the reference voltage $V_{xm}$, and the control terminal of the transistor Q7 receives the reference voltage $V_{ym}$.

In this example, a second terminal of the transistor Q4 is further coupled to a first terminal of the transistor Q9, the second terminal of the transistor Q9 is coupled to a first terminal of the resistor R1 to output the signal $S_1-$, and a control terminal of the transistor Q9 is configured to receive the bias signal $V_{B3}$. A second terminal of the transistor Q5 is further coupled to a first terminal of the transistor Q10, a second terminal of the transistor Q10 is coupled to a first terminal of the resistor R2 to output the signal $S_1+$, and a control terminal of the transistor Q10 is configured to receive the bias signal $V_{B3}$. A second terminal of the resistor R1 and that of the resistor R2 are coupled to the power rail 301 to receive the ground voltage GND. With the folded cascode configuration, the double differential amplifier circuit 162-1 (or 162-2) may tolerate higher voltage swing, in order to be sufficient to work in the predetermined operation region under the extreme bias condition.

The implementations of the double differential amplifier circuit 162-1 (or 162-2) are given for illustrative purposes, and the present disclosure is not limited thereto. Various folded cascode amplifier circuits able to implement the double different amplifier circuit 162-1 (or 162-2) are within the contemplated scope of the present disclosure.

In the above one or more embodiments, certain transistors are N-type transistors, and certain transistors are P-type transistors. Each aforementioned transistor may be implemented with a metal oxide silicon field effect transistor (MOSFET), but the present disclosure is not limited thereto. Various kinds or conductivity types of transistors that are able to implement similar operations are within the contemplated scope of the present disclosure.

As mentioned above, in some embodiments of the present disclosure, comparator circuit having different circuit architectures are employed in the flash analog to digital converter, and thus the amplifier circuit of the comparator circuit is able to operate in the predetermined operation region under the extreme bias condition or under the case where the input signal having higher swing, in order to improve the reliability of overall operations.

Various functional components or blocks have been described herein. As will be appreciated by persons skilled in the art, in some embodiments, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

The aforementioned descriptions represent merely some embodiments of the present disclosure, without any intention to limit the scope of the present disclosure thereto. Various equivalent changes, alterations, or modifications based on the claims of present disclosure are all consequently viewed as being embraced by the scope of the present disclosure.

What is claimed is:
1. A flash analog to digital converter, comprising:
a voltage generator circuit configured to generate a first set of reference voltages according to a first voltage and a second voltage;
an encoder circuit configured to generate a digital signal corresponding to an input signal according to a plurality of first signals;
a first double differential amplifier circuit configured to compare the input signal with a first reference voltage in the first set of reference voltages, in order to generate a corresponding one of the plurality of first signals; and
a second double differential amplifier circuit configured to compare the input signal with a second reference voltage in the first set of reference voltages, in order to generate a corresponding one of the plurality of first signals, wherein a difference between the first voltage and the first reference voltage is less than a difference between the first voltage and the second reference voltage, and the first double differential amplifier circuit and the second double differential amplifier circuit have different circuit architectures.

2. The flash analog to digital converter of claim 1, wherein the first reference voltage is a voltage closet to the first voltage in the first set of reference voltages.

3. The flash analog to digital converter of claim 1, wherein the first double differential amplifier circuit comprises a first current path between a first power rail and a second power rail, the second double differential amplifier circuit comprises a second current path between the first power rail and the second power rail, and a number of stacked transistors in the first current path is less than a number of stacked transistors in the second current path.

4. The flash analog to digital converter of claim 1, further comprising:
  a third double differential amplifier circuit configured to compare the input signal with a third reference voltage in the first set of reference voltages, in order to generate a corresponding one of the plurality of first signals,
  wherein a difference between the second voltage and the third reference voltage is less than a difference between the second voltage and the second reference voltage, and the third double differential amplifier circuit and the second double differential amplifier circuit have different circuit architectures.

5. The flash analog to digital converter of claim 4, wherein the first double differential amplifier circuit and the third double differential amplifier circuit have the same circuit architecture.

6. The flash analog to digital converter of claim 4, wherein the third reference voltage is a voltage closet to the second voltage in the first set of reference voltages.

7. The flash analog to digital converter of claim 4, wherein the third double differential amplifier circuit comprises a first current path between a first power rail and a second power rail, the second double differential amplifier circuit comprises a second current path between the first power rail and the second power rail, and a number of stacked transistors in the first current path is less than a number of stacked transistors in the second current path.

8. The flash analog to digital converter of claim 1, wherein the first double differential amplifier circuit is a portion of a first comparator circuit, and the second double differential amplifier circuit is a portion of a second comparator circuit.

9. The flash analog to digital converter of claim 1, wherein the first double differential amplifier circuit is a folded cascode amplifier circuit.

10. The flash analog to digital converter of claim 1, further comprising:
  an interpolation network configured to perform an interpolation according to the plurality of first signals, in order to generate a plurality of second signals,
  wherein the encoder circuit is further configured to encode the plurality of second signals to generate the digital signal.

11. The flash analog to digital converter of claim 10, wherein the interpolation network comprises:
  a plurality of amplifier circuits, wherein each of the plurality of amplifier circuits is configured to generate a corresponding one of the plurality of second signals according to one or two of the plurality of first signals.

12. The flash analog to digital converter of claim 11, further comprising:
  a plurality of latch circuits configured to generate a plurality of third signals according to the plurality of second signals,
  wherein the encoder circuit is configured to encode the plurality of third signals to generate the digital signal.

13. The flash analog to digital converter of claim 1, wherein the reference voltage generator circuit comprises:
  a plurality of resistors configured to operate as a voltage divider circuit, in order to generate the first set of reference voltages according to the first voltage and the second voltage.

14. The flash analog to digital converter of claim 1, further comprising:
  a plurality of latch circuits configured to generate a plurality of second signals according to the plurality of first signals,
  wherein the encoder circuit is configured to encode the plurality of second signals to generate the digital signal.

* * * * *